United States Patent
Mecikalski

(10) Patent No.: US 11,125,915 B2
(45) Date of Patent: Sep. 21, 2021

(54) WEATHER FORECASTING SYSTEMS AND METHODS TRACKING CUMULUS CLOUDS OVER TERRAIN

(71) Applicant: John R. Mecikalski, Madison, AL (US)

(72) Inventor: John R. Mecikalski, Madison, AL (US)

(73) Assignee: Board of Trustees of the University of Alabama, for and on behalf of the University of Alabama in Huntsville, Huntsville, AL (US)

(*) Notice: Subject to any disclaimer, the term of this patent is extended or adjusted under 35 U.S.C. 154(b) by 0 days.

(21) Appl. No.: 16/818,723

(22) Filed: Mar. 13, 2020

(65) Prior Publication Data

US 2020/0348447 A1      Nov. 5, 2020

Related U.S. Application Data

(63) Continuation of application No. 15/082,744, filed on Mar. 28, 2016, now Pat. No. 10,718,884.

(60) Provisional application No. 62/236,224, filed on Oct. 2, 2015, provisional application No. 62/259,456, filed on Nov. 24, 2015.

(51) Int. Cl.
| | |
|---|---|
| *G01W 1/10* | (2006.01) |
| *G06F 30/20* | (2020.01) |
| *G06F 17/10* | (2006.01) |
| *G06N 20/00* | (2019.01) |

(52) U.S. Cl.
CPC ............. *G01W 1/10* (2013.01); *G06F 17/10* (2013.01); *G06F 30/20* (2020.01); *G06N 20/00* (2019.01); *G06T 2207/30192* (2013.01)

(58) Field of Classification Search
CPC ..... G01W 1/10; G01W 2201/00; G06F 17/10; G06F 30/20; G06T 2207/30192; G06N 20/00; G06N 20/10
See application file for complete search history.

(56) References Cited

U.S. PATENT DOCUMENTS

| | | |
|---|---|---|
| 6,581,009 B1 | 6/2003 | Smith |
| 6,920,233 B2 | 7/2005 | Wofson et al. |

(Continued)

OTHER PUBLICATIONS

Lee et al. "iJADE WeatherMAN: A Weather Forecasting System Using Intelligent Multiagent-Based Fuzzy Neuro Network". IEEE Transactions on Systems, Man, and Cybernetics—Part C: Applications and Reviews, vol. 34, No. 3, Aug. 2004. 9 Pages. (Year: 2004).*

(Continued)

*Primary Examiner* — Eunhee Kim
(74) *Attorney, Agent, or Firm* — Maynard Cooper & Gale, P. C.; Jon E. Holland

(57) ABSTRACT

A weather forecasting system has memory for storing satellite image data and numerical weather prediction (NWP) model data, which indicates predicted atmospheric conditions for a geographic region. At least one processor is programmed to identify a cumulus cloud within the satellite image data and to define a zone of influence around the cumulus cloud. The zone of influence represents a boundary for the NWP model data to be used by the processor for predicting whether the cumulus cloud will produce a weather event (e.g., precipitation, convective storm, etc.) in the future.

14 Claims, 4 Drawing Sheets

(56) References Cited

U.S. PATENT DOCUMENTS

| | | |
|---|---|---|
| 6,961,061 B1 | 11/2005 | Johnson et al. |
| 7,043,368 B1 | 5/2006 | Cote et al. |
| 7,062,066 B2 | 6/2006 | Wolfson et al. |
| 7,181,345 B2 | 2/2007 | Rosenfeld et al. |
| 7,250,952 B2 | 7/2007 | Johnson et al. |
| 7,391,358 B2 | 6/2008 | Dupree et al. |
| 7,403,854 B1 | 7/2008 | Hurley |
| 7,505,604 B2 | 3/2009 | Zakrzewski et al. |
| 7,729,510 B2 | 6/2010 | Zakrzewski et al. |
| 8,818,029 B1 * | 8/2014 | Mecikalski ............ G01W 1/10 382/103 |
| 8,930,299 B2 | 1/2015 | Pyle et al. |
| 10,318,558 B2 * | 6/2019 | Cipriani ................. G06F 16/29 |
| 2012/0065788 A1 * | 3/2012 | Harper, III ............. G06F 1/329 700/291 |
| 2012/0185414 A1 | 7/2012 | Pyle |
| 2014/0164306 A1 * | 6/2014 | Datta .................. G09B 29/007 706/46 |
| 2016/0104059 A1 | 4/2016 | Wang et al. |
| 2017/0075034 A1 | 3/2017 | Kleeman |

OTHER PUBLICATIONS

Harris, et al, "The Definition of GOES Infrared Lighting Initiation Interest Fields," Journal of Applied Meteorology and Climatology, May 25, 2010, 50 Pages.

Mecikalski, et al., "Forecasting Convective Initiation by Monitoring the Evolution of Moving Cumulus in Daytime GOES Imagery," IHOP_2002 Covective Initiation Special Issue, Monthly Weather Review, Oct. 12, 2004, 65 pages.

MacKenzie, et al., "The Advantages of Using the Goes 3.9 μm Channel for Convective and Lighting Initiation Nowcasting," JGR-Atmospheres, May 19, 2009, 43 pages.

Mecikalski, et al., "Cloud-Top Properties of Growing Cumulus prior to Convective Initiation as Measured by Meteosat Second Generation. Part I: Infrared Fields," Journal of Applied Meteorology and Climatology, vol. 49, Mar. 2010, pp. 521-534.

Mecikalski, et al., "Cloud-Top Properties of Growing Cumulus prior to Convective Initiation as Measured by Meteosat Second Generation. Part II: Use of Visible Reflectance," Journal of Applied Meteorology and Climatology, vol. 49, Dec. 2010, pp. 2544-2558.

Rosenfield, et al., "Satellite detection of severe convective storms by their retrieved vertical profiles of cloud particle effective radius and thermodynamic phase," Feb. 23, 2008, Journal of Geophysical Research, vol. 113, 22 pages.

Mecikalski, U.S. Appl. No. 15/092,988, entitled, "Systems and Methods for Forecasting Lightning and Severe Storms," filed Apr. 7, 2016.

Mecikalski, U.S. Appl. No. 15/217,731, entitled, "Systems and Methods for Forecasting Weather," filed Jul. 22, 2016.

Mecikalski, U.S. Appl. No. 15/082,744, entitled, "Systems and Methods for Forecasting Weather Based on Numerical Weather," filed Mar. 28, 2016.

Mecikalski, U.S. Appl. No. 15/073,304, entitled, "Weather Forecasting Systems and Methods," filed Mar. 17, 2016.

* cited by examiner

WEATHER FORECASTING SYSTEMS AND METHODS TRACKING CUMULUS CLOUDS OVER TERRAIN

CROSS REFERENCE TO RELATED APPLICATIONS

This application is a continuation of U.S. Pat. No. 10,718,884, entitled, "Systems and Methods for Forecasting Weather Based on Numerical Weather Prediction Model Data" and filed on Mar. 28, 2016, which is incorporated herein by referenced. U.S. Pat. No. 10,718,884 claims priority to U.S. Provisional Patent Application No. 62/236,224, entitled "Weather Forecasting Systems and Methods" and filed on Oct. 2, 2015, which is incorporated herein by reference. U.S. Pat. No. 10,718,884 also claims priority to U.S. Provisional Patent Application No. 62/259,456, entitled "Weather Forecasting Systems and Methods" and filed on Nov. 24, 2015, which is incorporated herein by reference.

STATEMENT REGARDING FEDERALLY SPONSORED RESEARCH OR DEVELOPMENT

This invention was made with Government support under NNX10AO07G awarded by the National Aeronautics and Space Administration. The Government has certain rights in the invention.

RELATED ART

Advances in weather forecasting enable meteorologists to provide more accurate forecasts and earlier warnings of significant weather events, such as tornadoes, severe storms, and related hazards (e.g., high winds, large hail, flooding rains, etc.). Unfortunately, accurate weather forecasting remains an inherently difficult process, especially in the 0-6 hour timeframe (so-called "nowcasting"), and better forecasting techniques are generally desired to enhance accuracy and provide even earlier warnings in advance of significant weather events.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure generally pertains to weather forecasting systems and methods. In one exemplary embodiment, a weather forecasting system has a data processing system that receives weather data from one or more sources and processes such data in conjunction with a weather forecasting algorithm in order to forecast weather for one or more geographic regions. In this regard, the weather data is input into a machine learning algorithm, which applies learned weights and relationships to the inputs in order to calculate at least one score indicating the probability that precipitation or other weather event will occur in the future within a certain time period (e.g., within the next 1 hour or some other unit of time) in one or more geographic regions. For each such geographic region, the weather forecasting logic may also predict the extent to which rain or other precipitation, lightning, or other weather event will occur during the time period. The predictions of the weather forecasting logic may then be used to provide a probabilistic weather map, thereby providing users with a graphical illustration of the areas predicted to be affected by precipitation or other weather event within the time period.

Figure 1:
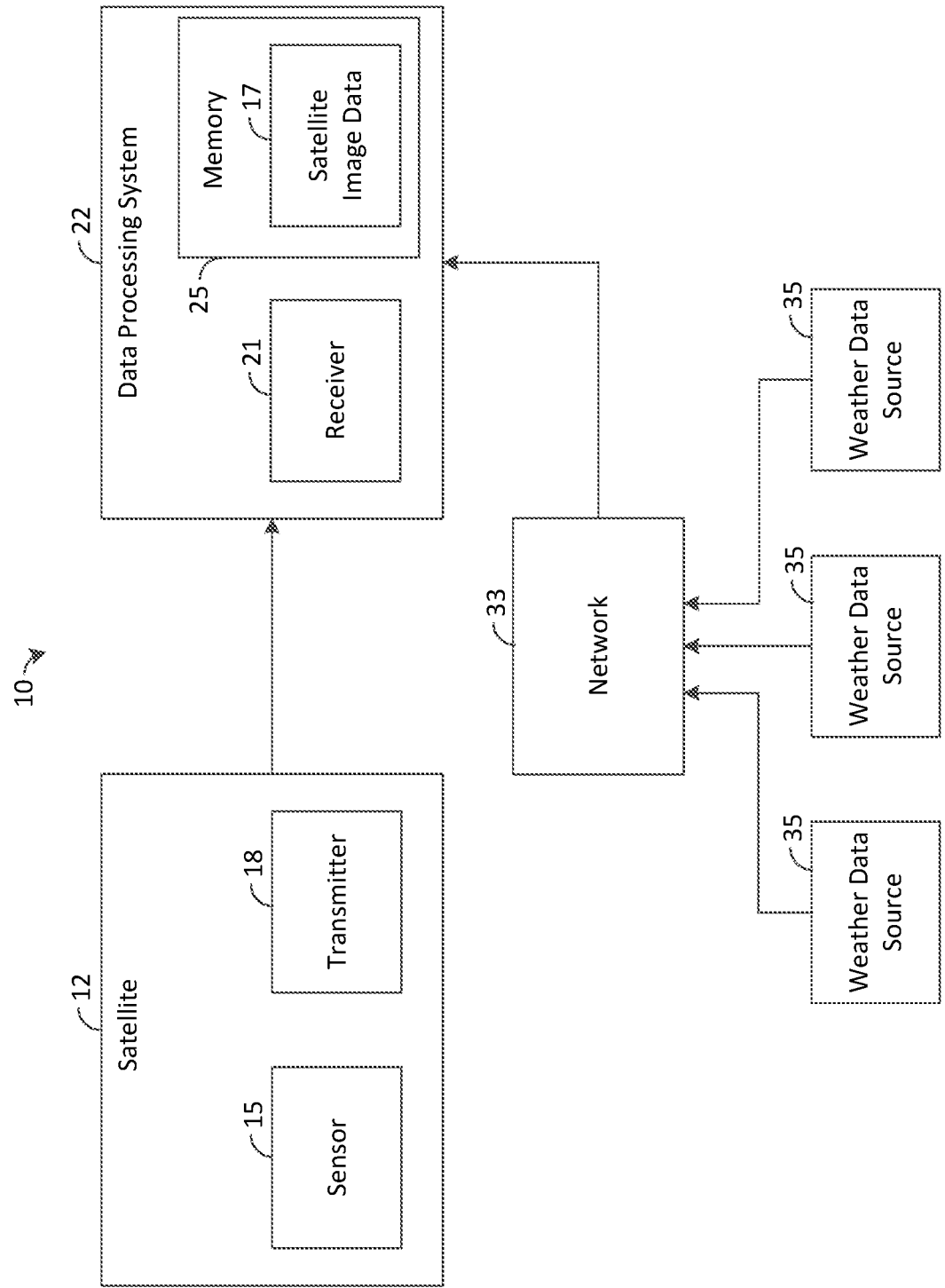
FIG. 1 is a block diagram illustrating an exemplary embodiment of a weather forecasting system.

FIG. 1 depicts an exemplary embodiment of a weather forecasting system 10. The system 10 comprises a satellite 12 that orbits the Earth. In one exemplary embodiment, the satellite is a Geostationary Operational Environment Satellite (GOES), though other types of satellites may be used in other embodiments. As shown by FIG. 1, the satellite 12 comprises at least one sensor 15 for detecting light or other energy from the Earth (e.g., sunlight reflected from the terrain, clouds, and other objects). In an exemplary embodiment, the sensor 15 comprises NASA MODerate resolution Infrared Spectroradiometer (MODIS) Terra and Aqua sensors for detecting light and thermal energy and generating parameters, for example, parameters indicative of surface temperatures, elevation, topography, sensible heating, soil moisture and vegetation in a geographic region, though other sensors may measure other data and parameters in other embodiments. Light and thermal energy measured by the sensor 15 are used to form data 17, referred to herein as "satellite image data," which is wirelessly transmitted from a transmitter 18 to a receiver 21 of a data processing system 22 located on Earth. As shown by FIG. 1, the data processing system 22 has memory 25 for storing the satellite image data 17 received from the satellite 12.

Each frame of satellite image data 17 has a plurality of pixels in which each pixel represents a respective geographic region. As an example, as will be described in more detail hereafter, each pixel might represent a 1 kilometer (km)-by-1 km region of the Earth or a region of some other size. Each pixel has a value indicative of the visible light or radiance detected from the geographic region associated with the pixel. As an example, in one exemplary embodiment, the pixel value for visible light is measured by the reflectivity of the light from objects (e.g., clouds, terrain, etc.) that are viewable by the satellite 12 within the associated geographic region. In addition, for infrared wavelengths, the pixel value is converted from raw radiance into a temperature value. In this regard, the temperature value represents the approximate temperature of the illuminated objects (e.g., clouds, terrain, etc.) that are viewable by the satellite 12 within the associated region. Other types of pixel values are possible in other embodiments.

The satellite 12 may have multiple sensors 15 for sensing multiple image frames for different wavelengths. Exemplary techniques for sensing wavelengths of light and image frames are discussed in detail in the commonly-assigned U.S. Pat. No. 8,818,029, entitled "Weather Forecasting Systems and Methods" and issued on Aug. 26, 2014, which is incorporated herein by reference. In the instant embodiment, for the satellite image data captured by the satellite 12, each pixel of the frame for visible light represents a 1 km-by-1 km geographic region (i.e., has a 1 km resolution), and the frames for infrared radiance have a 4 km resolution.

In other embodiments, other wavelengths and resolutions are possible, and each sample may have any number of image frames.

As shown by FIG. 1, the data processing system 22 may be communicatively coupled to a network 33 for communicating with one or more weather data sources 35. The network 33 may comprise one or more conventional networks, such as a local area network (LAN) and/or a wide area network (WAN). In one exemplary embodiment, the network 33 comprises the Internet, but other types of networks are possible in other embodiments.

Each weather data source 35 provides weather data to the data processing system 22, as will be described in more detail hereafter. As an example, a weather data source 35 may include the National Weather Service, a television station, or other type of source that provides data indicative of weather conditions or predictions.

Figure 2:
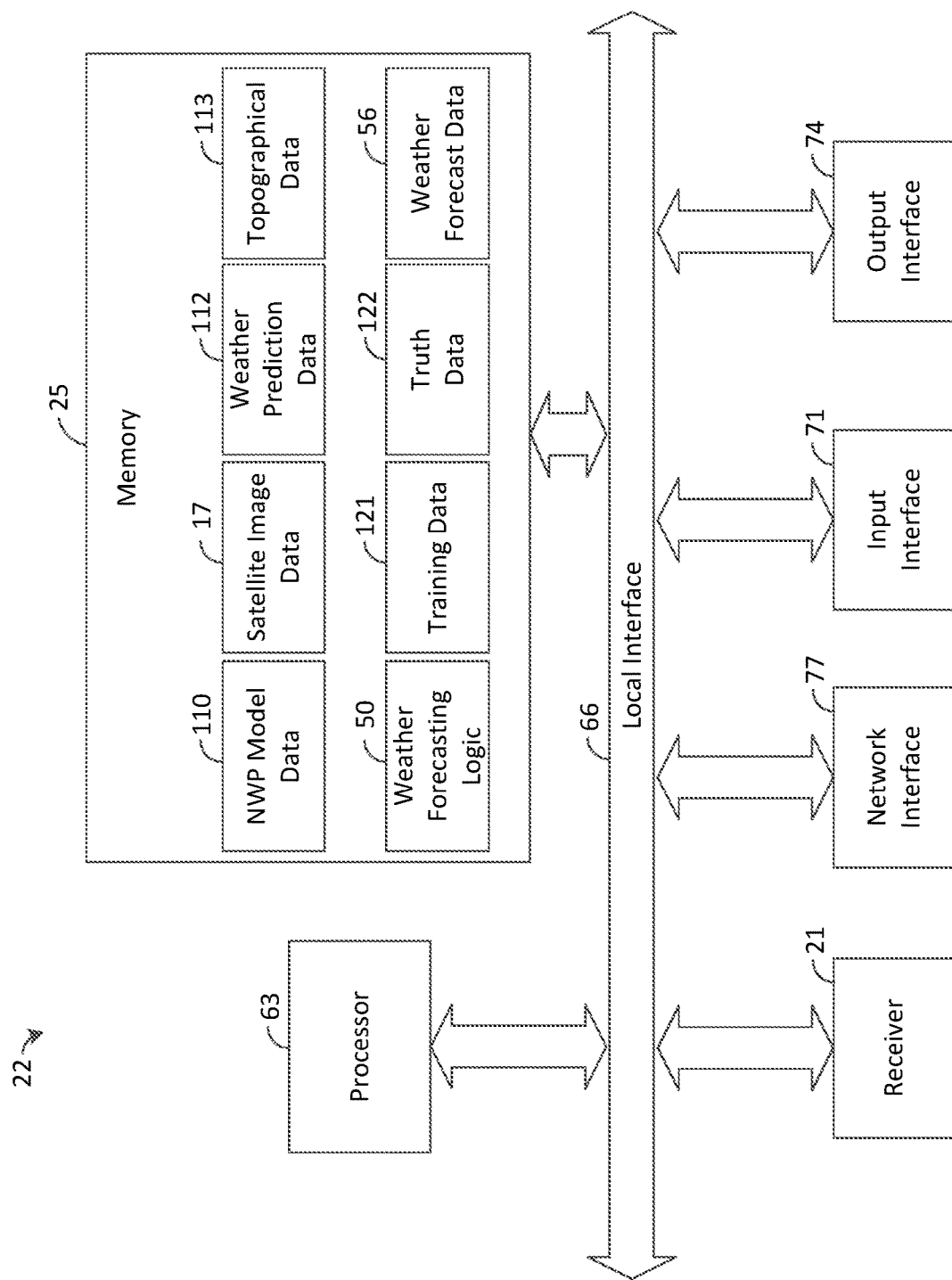
FIG. 2 is a block diagram illustrating an exemplary embodiment of a data processing system of a weather forecasting system, such as is depicted by FIG. 1.

FIG. 2 depicts an exemplary embodiment of the data processing system 22. As shown by FIG. 2, the data processing system 22 has weather forecasting logic 50 that is configured to use the satellite image data 17 and/or other weather data to make weather predictions and form weather forecast data 56, as will be described in more detail hereafter. It should be noted that the weather forecasting logic 50 can be implemented in software, hardware (e.g., gate arrays), firmware, or any combination thereof. In the exemplary embodiment illustrated in FIG. 2, the weather forecasting logic 50 is implemented in software and stored in the memory 25 of the data processing system 22.

Note that the weather forecasting logic 50, when implemented in software, can be stored and transported on any computer-readable medium for use by or in connection with an instruction execution apparatus that can fetch and execute instructions. In the context of this document, a "computer-readable medium" can be any means that can contain or store a program for use by or in connection with an instruction execution apparatus.

The exemplary embodiment of the data processing system 22 depicted by FIG. 2 comprises at least one conventional processor 63, that communicates to and drives the other elements within the system 22 via a local interface 66, which can include at least one bus. When the weather forecasting logic 50 is implemented in software, the processor 63 may be programmed with and execute the instructions of the logic 50 in order to implement the functionality described herein for the logic 50. Furthermore, an input interface 71, for example, a keyboard, keypad, or a mouse, can be used to input data from a user of the system 22, and an output interface 74, for example, a printer or a display device, e.g., a liquid crystal display (LCD), can be used to output data to the user. The data processing system 22 also comprises a network interface 77, such as a modem or other transceiver, for communicating with the network 33 (FIG. 1).

As shown by FIG. 2, the system 22 stores various sets of data that the weather forecasting logic 50 uses to forecast weather within one or more geographic regions. As an example, the system 22 may store numerical weather prediction (NWP) model data 110 indicative of a predicted weather forecast during a certain time frame (e.g., 0 to 6 hours) in the future. Such data may be provided by the National Weather Service (NWS) or some other source and indicates where precipitation is predicted to occur and/or indicates predicted atmospheric characteristics for an environment. In this regard, as known in the art, a given geographic region may be segmented into a plurality of sub-regions where each sub-region corresponds to one or more pixels of a satellite image from which the forecast is, at least in part, derived. For each sub-region, the NWP model data 110 may indicate the extent to which precipitation or other atmospheric event or condition is expected to occur for each of a plurality of time frames in the future. As an example for a given sub-region and time frame, the NWP model data 110 may include a value indicative of a probability that precipitation will occur in the sub-region and a value indicative of an extent to which such precipitation, if any, will likely occur. A map indicative of the extent to which precipitation has occurred, is occurring, or is expected to occur is generally referred to as a "radar map" as such map is usually based on radar echoes or returns.

The NWP model 110 may indicate various other types of information. As an example, the NWP model 110 may include data from measurements, observations, or calculation indicative of current and/or predicted atmospheric conditions (e.g., wind speed, wind direction, moisture, convective instability, convective inhibition, etc.) for various regions. The NWP model data 110 may be indicative of various other types of atmospheric conditions in other embodiments.

The system 22 also stores satellite image data 17 from the satellite 12. As indicated above, for each sub-region, the satellite image data 17 defines one or more pixels indicative of an intensity or color of light reflected from clouds or terrain within a sub-region corresponding to the one or more pixels. For each pixel, the data 17 may define images for multiple wavelengths. Exemplary sets of satellite image data 17 are described in more detail in U.S. Pat. No. 8,818,029.

The system 22 further stores one or more sets of weather prediction data 112. Similar to the NWP model data 110, the weather prediction data 112 is indicative of at least one predicted weather forecast during a certain time frame (e.g., 0 to 6 hours) in the future. Each set of data 112 may be provided by a different source or algorithm and may indicate where precipitation is predicted to occur. For example, for each sub-region, the weather prediction data 112 indicates the extent to which precipitation is expected to occur for each of a plurality of time frames in the future. As an example for a given sub-region and time frame, the weather prediction data 112 may include a value indicative of a probability that precipitation will occur in the sub-region and a value indicative of an extent to which such precipitation, if any, will occur. The prediction data 112 may be received from a variety of sources, such as meteorologists at television stations or other locations. In one embodiment, at least one set of the data 112 is generated by an algorithm for tracking cumulus clouds and predicting when the cumulus clouds will produce precipitation, as described by U.S. Pat. No. 8,818,029. The data 112 may also include any of a plurality of interest field scores, as described by U.S. Pat. No. 8,818,029, on which precipitation predictions may be based. In some embodiments, the weather prediction data 112 may be generated by the weather forecasting logic 50 based on the NWP model data 110, the satellite image data 17, or other weather data. When forecast times are relatively long (e.g., longer than about 1 hour), the sub-region of data collection may be regarded as a "footprint" or "zone of influence" of input information that describes the forthcoming event (e.g., a footprint for convective storm development), as will be described in more detail hereafter. The sub-region can then be considered similar to this "footprint" for data collection processing and forecast output display purposes.

Also stored at the processing system 22 is topographical data 113 indicative of the topology of the various sub-regions analyzed by the weather forecasting logic 50. For each sub-region, the data 113 indicates information about terrain characteristics within the sub-region. As an example, for a given sub-region, the topographical data 113 may indicate the average slope and elevation of the terrain in the sub-region. The data 113 may also indicate the type (e.g., water, land, barren, dense vegetation, etc.) of terrain that is within the sub-region. In this regard, terrain can have a pronounced effect on weather. For example, air masses tend to move faster over water than land. Thus, there is a greater likelihood that air masses will converge at the boundary between land and a large body of water, thereby increasing the probability that cumulus clouds will form near the boundary. In addition, clouds tend to form or build along steep slopes where the air is pushed upward as it travels through a region. Also, a sloped terrain is often heated by the Sun to a greater extent when sunlight strikes the surface more directly due to the angle of the slope. Such heating helps to create more updrafts, which enhance formation of cumulus clouds, and cumulus clouds have a relatively high probability of producing precipitation and storms (e.g., lightning). It is also possible for air to be funneled between peaks of high elevation. Many other topographical-based factors can affect the flow of air through a geographic region and also the formation of cumulus clouds. Sub-hourly and longer time trends in highly variable interest fields can also be defined.

Figure 3:
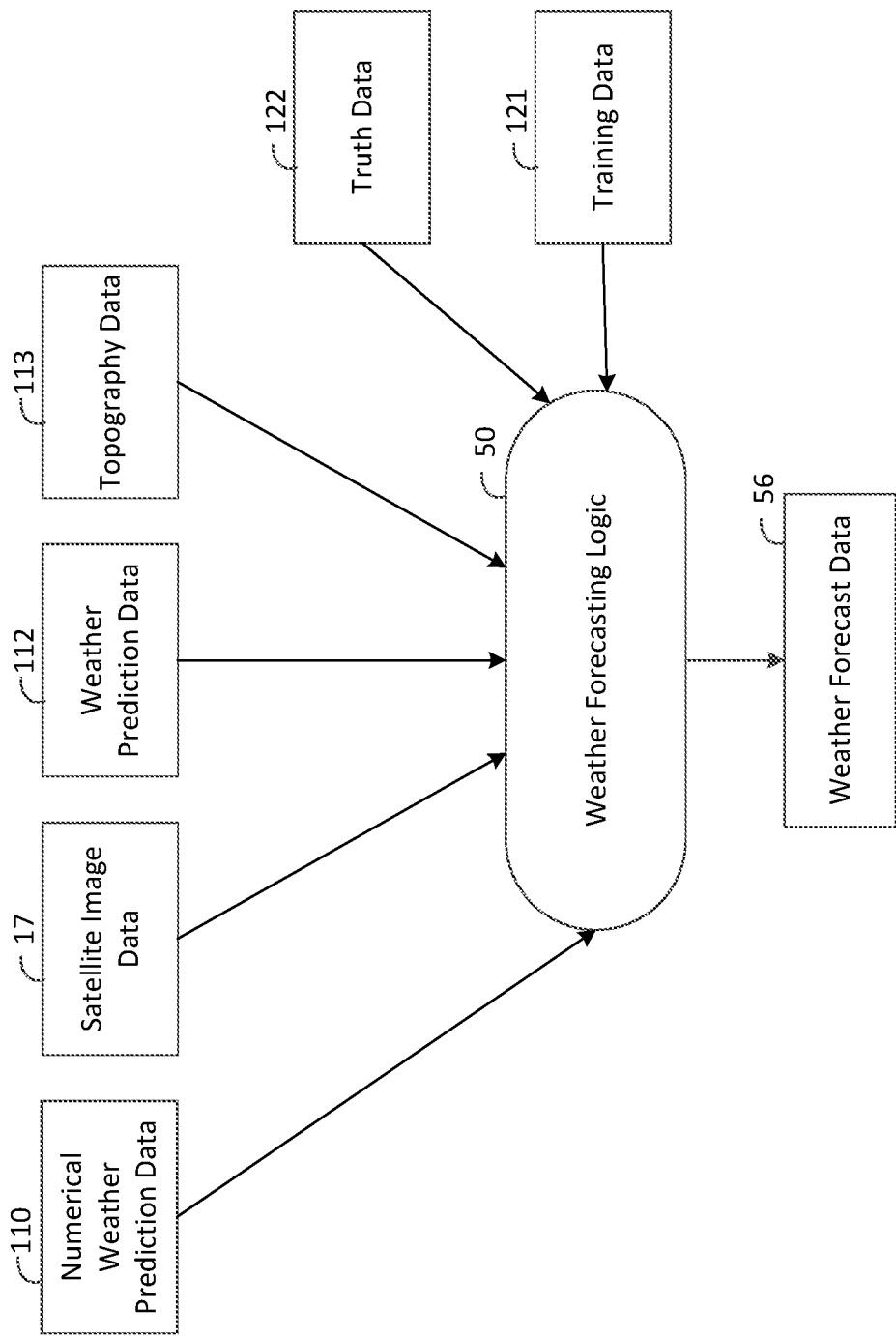
FIG. 3 is a block diagram illustrating an exemplary data flow for the data processing system depicted by FIG. 2.

Referring to FIG. 3, the weather forecasting logic 50 is configured to compare the NWP model data 110, the satellite image data 17, and/or the weather prediction data 112 to the topographical data 113 to time trends in interest fields to determine one or more interest fields that are indicative of how likely precipitation or cloud formation is in one or more sub-regions. As an example, one interest field may be a temperature differential field indicating the extent to which temperature gradients lead to low-level airflow convergence is predicted to occur in one or more sub-regions during a particular time period. For example, based on the topographical data 113 and at least one of the NWP model data 110, the satellite image data 17, and the weather prediction data 112, the weather forecasting logic 50 may determine that an air mass is moving across water and will likely converge with a slower moving air mass of a different temperature close to a boundary of the water. In such case, formation of cumulus clouds is likely close to such boundary. Thus, the weather forecasting logic 50 may determine a score of an interest field associated with sub-regions at or close to such boundary to indicate that the formation of cumulus clouds is likely to occur. In another example, the weather forecasting logic 50 may determine that warm, moist air is moving across terrain that slopes upward. As such air is forced upward, precipitation is more likely, and the weather forecasting logic 50 may determine a score of an interest field associated with sub-regions at or close to such terrain to indicate that the formation of cumulus clouds is likely to occur. Another set of forecast interest fields are sub-hourly or longer period trends in a given interest field (e.g., a two or three hour change in convective stability, or a 1 to 3 hour trend in the types of cumulus clouds and other clouds observed in a region). Time trends in a single-time interest field or in multiple interest fields can be used to determine trends leading to the occurrence of rain, lightning, and related convective storm hazards. Thus, the weather forecasting logic 50 may be configured to determine a score of an interest field associated with sub-regions close to the slope to indicate that precipitation or cloud formation is likely to occur. Many other types of interest fields may be determined based on topographical data 113 or otherwise.

The weather forecasting logic 50 is configured to analyze the NWP model data 117, the satellite image data 17, the weather prediction data 112, and the topographical data 113 in order to forecast the extent to which precipitation will likely occur in various sub-regions during one or more time periods. In an exemplary embodiment, the forecasts are made at predefined intervals referred to herein as "sample periods." As an example, the weather forecasting logic 50 may be configured to predict precipitation occurrence for each of a plurality of sample periods (where each sample period is a 20 minute period or a time period of some other length) over a certain time frame (e.g., the next 6 hours or a time period of some other length).

In one exemplary embodiment, the weather forecasting logic 50 uses a machine-learning algorithm in order to forecast the weather based on the NWP model data 110, the satellite image data 17, the weather prediction data 112, and the topographical data 113, and sub-hourly or longer time trends in these fields where appropriate. In this regard, the weather forecasting logic 50 uses information from the NWP model data 110, the satellite image data 17, the weather prediction data 112, and/or the topographical data in order to define input variables for the machine-learning algorithm, which performs a regression analysis on the input variables in order to define a regression equation for providing output indicative of the probability that precipitation or other weather event will occur in a given geographic region during a given sample period.

As an example, for each sub-region, the output may include a score, referred to hereafter as "forecast score," having a numerical range, such as from 0 to 100 (or some other range), where a higher value indicates a higher probability of precipitation for a given sample. The output may also include another score, referred to hereafter as "precipitation score," having a numerical range, such as from 0 to 100 (or some other range), where a higher value indicates that more precipitation is predicted to occur for the sub-region of a sample. Other types of scores and other outputs are possible in other embodiments. As an example, the weather forecasting logic 50 may generate a score indicating a severity or threat level for the sub-region, the probability or intensity of lightning strikes for the sub-region, or the probability of other weather events, such as heavy rainfall, hail or tornadoes. Using training data 121 and truth data 122, as will be described in more detail below, the weather forecasting logic 50 may learn the desired input variables and associated weights that provide the most accurate outcome (e.g., any of the scores described herein).

The output of the machine-learning algorithm is stored in memory 25 as weather forecast data 56. Such data 56 may define a map, which can be rendered (e.g., displayed) by the output interface 74 or some other device. As an example, a map of a geographic region of interest may be displayed where each sub-region of such geographic region corresponds to one or more pixels of the map image. A pixel corresponding to a given sub-region may be color coded to indicate the amount or probability of precipitation or other weather event that is predicted to occur in that sub-region in a certain time period.

Note that there are various types of input variables that may be used by the weather forecasting logic 50. As an example, for a given sub-region, the weather forecasting logic 50 may define an input variable based on a prediction for the sub-region indicated by the NWP model data 110 or the weather prediction data 112. As an example, for a given sub-region and sample period, the data 110 or 112 may include a forecast score or a precipitation score indicating the extent to which precipitation is likely during the sample period for the sub-region and/or an extent to which precipitation is expected during the sample period for the sub-region. The weather forecasting logic 50 may define an input variable based on one or both such scores. The logic 50 may also use as an input variable any interest field on which the forecast score or precipitation score is based. For a given input variable, the logic 50 may also use any interest field, sub-hourly or longer time trend in interest field, or score determined by the logic 50 based on the NWP model data 110, the satellite image data 17, the weather prediction data 112, or the topographical data 113, such as the interest field or score generated by comparing the topographical data 113 to the NWP model data 110, the satellite image data 17, and/or the weather prediction data 112 as described above. Note that any interest field may be based on past or current conditions (e.g., a past or current radar map) or predicted conditions in the future.

Further, the logic 50 may define an input variable based on satellite image data 17. As an example, an input variable for a sub-region may be based on a measurement for one or more pixels of the satellite image data 17. An input variable may also be based on the topographical data 113. As an example, for a given sub-region, the elevation or slope of the sub-region indicated by the topographical data 113 may be used as input variable. In yet other types of embodiments, other types of input variables may be used.

In one exemplary embodiment, the weather forecasting logic 50 learns a regression equation for forecasting weather by analyzing at least two sets of data, referred to hereafter as "training data 121" and "truth data 122." The training data 121 is a set of data that defines samples of the input variables that may be used by the weather forecasting logic 50 to predict precipitation during operation. As an example, the training data 121 may include samples of NWP model data 110, satellite image data 17, weather prediction data 112, and/or topographical data 113, as well as sub-hourly or longer trends in training data fields, to be used for the purpose of training the weather forecasting logic 50 to learn the regression equation. The truth data 122 indicates the forecast results that are desired for the input variables from the training data 121. That is, truth data 122 defines the desired outputs for the sample input variables indicated by the training data 121.

As an example, the training data 121 may define information indicative meteorological conditions (e.g., temperature, satellite images) measured for a geographic region at a time just prior to and leading up to an occurrence of a weather event (e.g., precipitation, thunderstorm, tornado, etc.) at such geographic region, and the truth data 122 may define information indicative of the precipitation or other weather event of interest actually measured at the geographic region for the weather event of interest, such as the amount of precipitation that occurred for the geographical region. That is, the training data 121 is indicative of the input variables measured prior to an occurrence of a weather event at the geographic region, and the truth data 122 is indicative of the desired output for such weather event (e.g., the precipitation associated with the weather event). Further, the training data 121 and the truth data 122 may respectively indicate the input variables and the desired output for many different weather events, such as previous storms, for which meteorological data has been collected to define the input variables and desired output.

The weather forecasting logic 50 is configured to use machine learning in order to define an equation, referred to hereafter as "forecast equation," that accurately defines relationships between the input variables and the desired output of the weather events. As known in the art, "machine learning" generally refers to neural computing techniques or artificial intelligence whereby a computer effectively "learns" relationships between inputs and outputs. In one exemplary embodiment, the weather forecasting logic 50 employs a random forest algorithm in order to learn the forecast equation, but other types of machine learning techniques are possible in other embodiments (e.g., support vector machines, Bayes, logistic regression, etc.). In learning the forecast equation, the weather forecasting logic 50 performs a regression analysis or other type of analysis on the training data 121 and the truth data 122 in order to define relationships between the input variables indicated by the training data 121 and the desired output (e.g., precipitation occurrence) indicated by the truth data 122. As an example, for each input variable of the forecast equation, the weather forecasting logic 50 may determine a suitable weight or scaling factor to be used for scaling the input variable such that, when the input variables for a given weather event are scaled and summed (or otherwise combined) according to the forecast equation, the result accurately corresponds to the desired output for that weather event. By defining the forecast equation such that this is substantially achieved for the input variables of many sample weather events, the forecast equation can be trained to be a relatively accurate predictor of actual weather events in the future.

Once the forecast equation is defined, the weather forecasting logic 50 may apply the equation to the input variables indicated by the NWP model data 110, the satellite image data 17, the weather prediction data 112, the topographical data 113, and/or sub-hourly or longer time trends in interest fields, in order to forecast weather, as described in more detail herein. Note that the algorithm used to define the forecast equation may adaptively update the forecast equation using the input variables processed by the weather forecasting logic 50 during operation. In this regard, once the logic 50 has made a prediction of the probability and/or amount of precipitation or other weather event (e.g., lightning) expected to occur based on a set of input variables, the actual precipitation (or other parameter of interest) that occurs can be measured and used to define truth data that is used to further train the forecast equation. However, such adaptive updates to the forecast equation are unnecessary in other embodiments.

Note that it is possible to define a single forecast equation that is used to forecast weather or precipitation in all sub-regions. However, in one embodiment, different forecast equations are generated for different sub-regions. For each such sub-region, the weather forecasting logic 50 may use training data 121 and truth data 122 associated with such respective sub-region (e.g., indicative of weather within or close to such sub-region). In this regard, different sub-regions may have different weather patterns due to a variety of factors, such as variations in temperature, jet streams, topography, etc. Using different forecast equations for different sub-regions enables each respective forecast equation to be tailored to the weather patterns that occur in its associated sub-region.

During operation, the weather forecasting logic 50 is configured to use training data 121 and truth data 122 to define a forecast equation for at least one sub-region of a geographic region. For such sub-region, the weather forecasting logic 50 uses weather data, such as the NWP model data 110, satellite image data 17, weather prediction data 112, and/or sub-hourly or longer time trends in interest fields, as well as possibly topographical data 113 or other data, in order to define input variables for the forecast equation. The logic 50 then applies the input variables to the forecast equation in order to calculate output, such as a forecast score and/or a precipitation score, indicative of the probability and/or extent to which precipitation of other weather event is predicted to occur in the future (e.g., for the next hour or some other time period) for the sub-region, and the logic 50 stores such output in the weather forecast data 56. The weather forecasting logic 50 similarly performs such analysis for other sub-regions.

In calculating a score for a given sub-region, the weather forecasting logic 50 may define a "footprint" or "zone of influence." As used herein, "footprint" and "zone of influence" have the same meaning and shall be used interchangeably. For a given sample and sub-region, the sub-region's footprint represents the region or "zone," including the zone outside of the sub-region, from which weather data is analyzed in order to calculate the score for such sub-region. That is, the footprint represents a boundary for the NWP model data to be used by the at least one processor for predicting whether at least one weather event (e.g., precipitation, a convective storm, etc.) will occur in the sub-region associated with the footprint (e.g., a sub-region where a cumulus cloud is located or predicted to be located). As a mere example, for a 4 km-by-4 km sub-region, a circle of having a radius of 50 km (or some other distance) may be defined around the sub-region, and the weather data from such footprint may be used by the weather forecasting logic 50 to calculate the sub-region's score. As an example, an interest field value may indicate the average amount of precipitation that is occurring or that occurred within the entire footprint. Such an interest field is affected by rainfall that occurs not just in the sub-region but also within the entire footprint (e.g., a circle having a radius of 50 km in the instant example). Thus, the footprint for a given sub-region defines a zone that is associated with a portion of the weather data (e.g., satellite image data, weather prediction data, etc.) to be analyzed by the weather forecasting logic 50 for determining the input variables to be used to calculate the forecast score for the sub-region.

Note that the footprint may have different sizes depending on interest field type or other factors, or may move as desired to track an evolving weather feature or weather event. As an example, the footprint may be large for one interest field and smaller for another interest field. Also, the size of the interest field may be based on the time associated with the weather data of the interest field. In addition, the location over which an interest field is computed may change as a weather feature or weather event moves and evolves. For example, the footprint associated with an interest field that is based on data measured five hours ago may be different (e.g., larger) than the footprint associated with an interest field that is based on data measured one hour ago. As an example, the footprint of a first interest field indicating an average precipitation measured five hours ago may be larger than the footprint of a second interest field indicating an average precipitation measured one hour ago such that an area of rainfall measured five hours ago and affecting the first interest field is larger than the area of rainfall measured one hour ago and affecting the second interest field. The footprint over which an interest field is determined may be in a different location five hours ago as compared to a footprint for an interest field one hour ago, with the separation distance being a function of the movement of weather features or events that define the interest field. Thus, the footprint movement is related to and along the direction of wind.

In addition, the size and shape of a footprint may be dynamically selected by the weather forecasting logic 50 based on various conditions. As an example, the weather forecasting logic 50 may select a larger footprint if one or more interest fields indicate greater wind. In this regard, in windy conditions, weather conditions further away from a given sub-region may have a quicker effect on the weather in the sub-region relative to other times when conditions are less windy. Thus, increasing the size of the footprint during windy conditions may provide more accurate forecasts. In addition, the shape of the footprint may be based on various real-time weather conditions. As an example, the shape of the footprint may be more elongated as wind increases. For example, the shape of an interest field's footprint may be circular in low wind conditions, but such circle may be elongated in a direction parallel to wind in order to form an oval or some other shape for the footprint in high wind conditions. Thus, the footprint covers more area along the direction of the wind.

Controlling the footprints of the interest fields, as described above, helps to optimize the weather forecast by limiting the weather data as is appropriate depending on interest field type or other factors. In this regard, in some cases, using a larger footprint of weather data to define an interest field may decrease the effectiveness of the interest field in predicting a desired outcome by making the interest field dependent on too much data, thereby diluting the data that has a real effect on the desired outcome. However, in other cases, using a smaller footprint may undesirably omit weather data that has a significant effect on the desired outcome. Moreover, optimizing the size and shape of the footprint of an interest field, as described above, may help to increase the overall accuracy of the weather forecasts.

Note that the sub-region for which a zone of influence is defined may be the region corresponding to any pixel of a weather map. In one embodiment, the sub-region is a region in which a cumulus cloud is located or is predicted to be located, or is a region where a storm is predicted to be located. For example, as described further herein, the weather forecasting logic 50 may identify cumulus clouds within the satellite image data 17. For an identified cloud, the logic 50 may be configured to define a zone of influence around the cloud representing the region from which weather data is to be analyzed in order to predict whether the cloud will produce precipitation or be involved in some other weather event in the future.

When desired, the weather forecast data 56 generated by the weather forecasting logic 50 is rendered to one or more users. As an example, the weather forecasting logic 50 may provide the weather forecast data 56 to the output interface 74 for display to a user. In one embodiment, the weather forecast data 56 defines a map of a geographic region and indicates on the map sub-regions where precipitation or other weather event is expected during the relevant time period. For each sub-region, the map may indicate the amount of precipitation or other weather event that is expected to occur in the sub-region during the relevant time period, similar to a radar map. In other embodiments, the logic 50 may provide the weather forecast data 56 to other devices for rendering.

As indicated above, the weather prediction data 112 can be from a variety of sources and can be generated using a variety of algorithms. In one exemplary embodiment, at least a portion of the weather prediction data 112 is generated from an algorithm that tracks cumulus clouds and predicts which cumulus clouds will produce precipitation in the future. As an example, in one embodiment, the weather forecasting logic 50 is configured to analyze satellite image data 17 to identify cumulus cloud objects representing cumulus clouds and to then determine a score, referred to herein as "convective initiation score," for each cumulus cloud object indicating the probability that the cumulus cloud represented by such object will produce precipitation in a certain time period in the future, as described by U.S. Pat. No. 8,818,029. In U.S. Pat. No. 8,818,029, the convective initiation score is derived from various "interest field" tests indicative of weather patterns or factors that tend to influence cumulus cloud and thunderstorm formation. Note that the weather forecasting logic 50 may use interest field tests in addition to those specifically described by U.S. Pat. No. 8,818,029. If desired, the logic 50 may have various modules, such as a module for tracking clouds and a module for predicting weather events based on the tracked clouds.

In one embodiment, the weather forecasting logic 50 is configured to employ a machine learning algorithm in order to predict the thunderstorm severity of the cumulus cloud objects that are predicted to produce precipitation. In this regard, the weather forecasting logic 50 may use the results of any of the interest field tests and/or the convective initiation score that are used to predict whether the cloud represented by a cumulus cloud object will produce precipitation as input variables for a machine learning algorithm in order to predict the likely severity of the thunderstorm to be produced by such cloud. The weather forecasting logic 50 may also use other types of input variables. As an example, the weather forecasting logic 50 may perform various interest field tests indicative of the updrafts within a cumulus cloud represented by a cumulus cloud object and use the results of such interest field tests as input variables to the machine learning algorithm.

As an example, updrafts that grow faster and that are wider within a cumulus cloud tend to indicate a greater probability that the cloud will develop into a strong thunderstorm. By comparing images defined by the satellite image data 17, the weather forecasting logic 50 may determine an interest field value indicative of how fast a cloud or an updraft within the cloud is growing and/or how wide the updraft or cloud is. The logic 50 may use such interest field value as an input variable to the machine learning algorithm. In another example, the weather forecasting logic 50 determines an interest field value indicative of the microphysical characteristics or the average amount of precipitation as related to rainfall intensity within the cloud and uses such value as an input variable. Note that one or more interest field values may be combined (e.g., averaged) with other interest field values to define an input variable. In addition, an interest field may be a trend of a given characteristic indicating the extent to which the characteristic is changing over time. As an example, the weather forecasting logic 50 may determine values of an interest field for a given characteristic, such as the average amount of precipitation, for two successive samples and then determine the difference, which represents an interest field value indicative of a trend (e.g., a trend in average precipitation amounts). In another example, a size (e.g., height or width) of a cloud in one sample may be compared to a size of the same cloud in another sample to provide an interest field value indicative of cloud growth. In other examples, the trends of other characteristics may be determined and used.

The weather forecasting logic 50 is configured to apply a machine learning algorithm to the defined input variables to learn relationships between inputs and outputs, as described above, thereby defining a regression equation (referred to hereafter as "severity equation") is defined for providing output indicative of the likely severity of a storm associated with an identified cumulus cloud object. In learning the severity equation, the weather forecasting logic 50 may perform a regression analysis or other type of analysis on the training data 121 and the truth data 122, as previously described above, in order to define relationships between the input variables indicated by the training data 121 and the severity of storms indicated by the truth data 122. As an example, for each input variable of the severity equation, the weather forecasting logic 50 may determine a suitable weight or scaling factor to be used for scaling the input variable such that, when the input variables for a given cumulus cloud object are scaled and summed (or otherwise combined) according to the severity equation, the result accurately corresponds to the severity of the storm indicated by the truth data 122 for that cumulus cloud object. By defining the severity equation such that this is substantially achieved for the input variables of many sample cumulus cloud objects, the forecast equation can be trained to be a relatively accurate predictor of storm severity in the future (e.g., clouds that later become storms in the coming one hour or longer time period that may produce flooding rainfall, high or damaging surface winds, large hail, and/or tornadoes). Similar techniques and interest fields may be used to define other types of equations, such as the probability of or extent to which an identified cloud will produce precipitation during a certain time period in the future. Indeed, any of the interest fields described herein may be used as a factor for predicting any weather event as may be desired.

The weather prediction data 112 generated by weather forecasting logic 50 may include a weather map of a given geographic location, where each pixel is color-coded based on the severity (e.g., intensity of precipitation, or an ability of a storm to produce flooding rainfall, or to indicate a threat level for a pending severe weather type to include high or damaging winds, large hail, or tornadoes) expected to occur in the time period correlated with the map (e.g., 0 to 1 hours in the future or some other time period). As an example, an output of the machine learning algorithm may include, for each pixel, a value, referred to hereafter as "severity value," indicating the predicted severity of a storm expected to occur at the geographic location corresponding to the pixel, and the pixel may be color coded based on such value. For example, pixels associated with storms of greater severity (e.g., having severity values above a predefined threshold) may be assigned one color value whereas pixels associated with storms of less severity or no storms at all (e.g., having severity values below the predefined threshold) may be color coded a different color value.

As described above, various types of input variables can be used for a machine-learning algorithm in order provide a value indicative of the probability or severity of a certain weather event (e.g., precipitation, tornado, thunderstorm, etc.) occurring in a given geographic region. In one exemplary embodiment, which will be described in more detail below, the weather forecasting logic 50 uses various input variables to determine which cumulus clouds are developing into thunderstorms and then analyzes weather conditions in the zone of influence around such identified cumulus clouds to provide a value indicative of the probability or severity of a weather event associated with the cumulus cloud occurring in a certain time period in the future.

Figure 4:
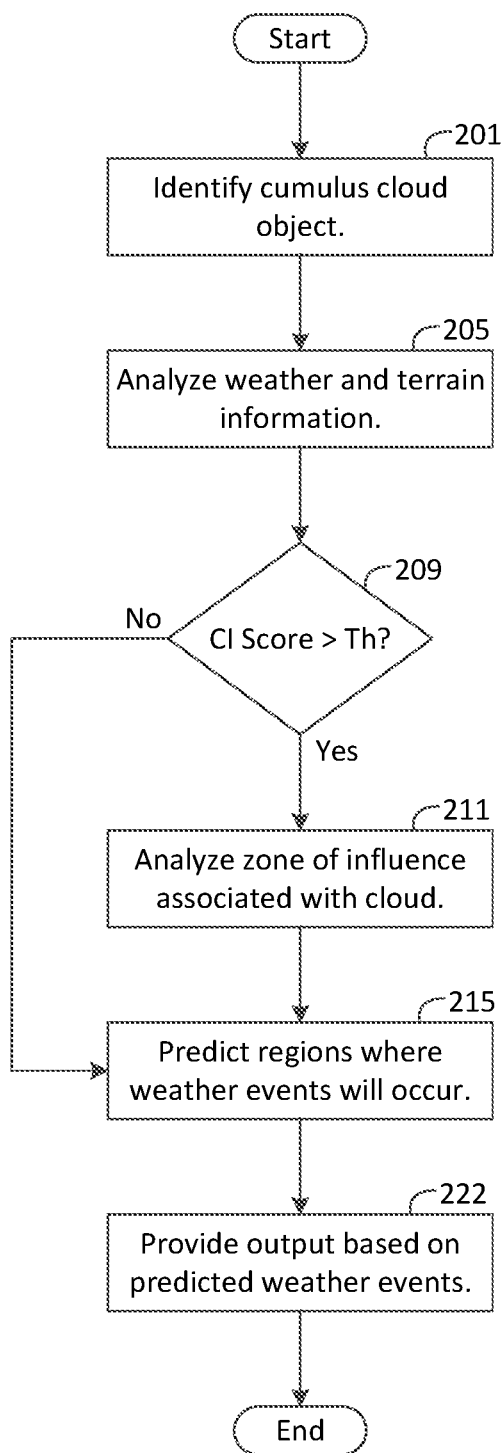
FIG. 4 is a flow chart illustrating an exemplary method for forecasting weather events.

In this regard, as described above, the weather forecasting logic 50 may be configured to analyze the satellite image data 17 in order to identify cumulus cloud objects representative of cumulus clouds within the satellite images, as shown by block 201 of FIG. 4. For each cumulus cloud object, the weather forecasting logic 50 analyzes weather and/or terrain information, such as NWP model data 110, satellite image data 17, weather prediction data 112, and/or topographical data 113, to determine a convective initiation (CI) score indicating a probability that the cumulus cloud represented by the cumulus cloud object will produce precipitation during a certain time period in the future, as shown by block 205 of FIG. 4. As an example, as described above, the weather forecasting logic 50 may apply a machine-learning algorithm or other type of algorithm to various input variables in order to determine the convective initiation score.

Although various types of input variables may be used, in one embodiment, the input variables include one or more parameters that indicate whether the cumulus cloud is growing and/or increasing in thunderstorm intensity. For example, the weather forecasting logic 50 may use interest fields from the satellite image data 17 and the numerical weather prediction model data, as described above, and one or more of the input variables may include a comparison of a value of an interest field for the cumulus cloud at one time (e.g., one image frame) and a value of the same interest field for the same cumulus cloud at a later time (e.g., a later image frame). As mere examples, an input variable may indicate a change in cloud size (such as width or height), a change in a strength of updrafts or downdrafts denoted by the ascent rate of the cloud tops, a change in the amount of precipitation that is occurring at a certain altitude (such as the $-10°$ C. altitude level), a change in the width of updraft or downdraft channels, or any other interest field value indicative of cloud or thunderstorm intensity growth. Other examples include the gradual evolution of convective cloud types, from "fair weather" cumulus to towering cumulus, as indicative of a capping inversion weakening or breaking in advance of thunderstorm development. Changes in the numerical weather prediction datasets that measure the instability or decrease in a capping inversion may also be considered.

Using the input variables, the weather forecasting logic 50 applies a machine-learning algorithm or other type of algorithm to determine a convective initiation score indicating the probability that the cumulus cloud will produce precipitation in a certain time period in the future. Note that the interest field values may be based on the NWP model data 110, satellite data 17, or any other data. As an example, for a given geographic region or cloud, the forecasting logic 50 may compare a precipitation intensity value from radar data (e.g., a radar map) for one sample to a precipitation intensity value from the radar data for a later sample, and define an interest field that is indicative of the difference, which represents whether and the extent to which precipitation is increasing or decreasing within the region or cloud.

Note also that cloud type may be an input variable to the machine-learning algorithm. In this regard, cumulus clouds can be categorized into various types, such as "fair weather" cumulus, humilis, cumulus congestus, towering cumulus, cumulonimbus or other types of cumulus or altocumulus clouds, and the weather forecasting logic 50 may be configured to analyze the weather data stored in the system 22 to identify the type of cumulus cloud represented by each identified cumulus cloud object. Such cloud type may be used as input variable as some cloud types are known to be The weather forecasting logic 50 also assesses the convective initiation to score to determine whether it is likely that the cumulus cloud will produce precipitation in the certain time period in the future, based on the input variables analyzed in block 205. As an example, the weather forecasting logic 50 may compare the convective initiation score to a threshold, as shown by block 209 of FIG. 4. In other embodiments, other types of scores may be compared in clock 209. If the threshold is exceeded in block 209, indicating that precipitation is likely, the weather forecasting logic 50 analyzes observations from the cloud's zone of influence, as shown by block 211 of FIG. 4. As an example, the weather forecasting logic 50 may assess whether and to the extent that the conditions around the cumulus cloud are conducive for cumulus cloud and thunderstorm formation.

As an example, based on the NWP model data 110 or otherwise, the weather forecasting logic 50 may analyze interest field values indicative of wind shear, moisture (e.g., humidity measurements), as well as interest field values indicating whether the air around the cloud is stable. Fields of convective available potential energy (being zero) may, for example, be used to determine a stable atmosphere, whereas positive convective available potential energy values may indicate an unstable atmosphere, favorable for thunderstorm development. The likelihood that the cumulus cloud will grow and develop into a thunderstorm that will produce precipitation generally increases if the conditions in the zone of influence indicate greater wind shear, more moisture, and unstable air. The weather forecasting logic 50 is configured to use the interest field values from the zone of influence (which indicate conditions within the zone of influence) as factors in determining the probability that the cumulus cloud will produce precipitation or other weather event (e.g., lightning, tornado, etc.). As an example, the weather forecasting logic 50 may use the interest field values or comparisons of the interest field values from one time period to another (as previously described above) as input variables to a machine-learning algorithm (e.g., the same or similar algorithm used in block 205) to calculate, adjust, or characterize the convective initiation score. For example, if the zone of influence values indicate that the conditions around the cumulus cloud are conducive for cumulus cloud or thunderstorm growth, the weather forecasting logic 50 may increase the convective initiation score to indicate that there is a greater probability of precipitation or other weather event of interest occurring.

Based on the analysis performed by the weather forecasting logic 50 (e.g., the convective initiation score or other type of value), the logic 50 identifies in which sub-regions the weather event (e.g., precipitation) will likely occur during a certain time period in the future, as shown by block 217 of FIG. 4. In this regard, the weather forecasting logic 50 is configured to predict the locations of the cumulus clouds represented by the identified cumulus cloud objects based on the movement of the cloud objects in multiple frames and/or other information, such as wind velocities within the NWP model data 110 or other data. In addition, based on the convective initiation scores of the cumulus cloud objects, the weather forecasting logic identifies each cumulus cloud object representing a cumulus cloud predicted to produce precipitation during the time period of interest. The logic 50 also identifies each sub-region over which such a cumulus cloud passes. The weather forecasting logic 50 assigns each such sub-region a precipitation score corresponding to the convective initiation score for the cumulus cloud. Based on such precipitation scores, the weather forecasting logic 50 may provide an output, as shown by block 222 of FIG. 4, such as a map where each sub-region is color coded based on its precipitation score, which indicates the probability that precipitation will occur in the that sub-region during the time period of interest. In other embodiments, other types of outputs are possible.

Note that using machine learning is unnecessary in at least some embodiments, and it is possible to calculate the convective initiation score for a given cloud using other techniques, such as predefined equations based on various interest fields or interest field combinations. As an example, in one embodiment, the forecasting logic 50 identifies cloud objects using techniques similar to those described by U.S. Pat. No. 8,818,029. The convective initiation score for a given cloud may be based on many different interest fields, including interest fields derived from the NWP model data 110 or other weather data for regions within a zone of influence of the cloud, as described in more detail herein, regardless of whether machine learning is employed.

In addition, any of the techniques described herein for calculating a convective initiation score may be used for calculating a forecast score or a precipitation score and vice versa. As an example, the convective initiation score for a given cloud may be calculated using measurements within the cloud and/or from a zone of influence around the cloud such that the convective initiation score is greater if the conditions within the cloud and/or around the cloud are conducive for thunderstorm growth. Such calculations may be performed using a regression equation derived from a machine learning algorithm or other types of equations or analysis. Similarly, the forecast score or precipitation for a given sub-region may be calculated using measurements for the sub-region and/or from a zone of influence around the sub-region such that the forecast score is greater if the conditions within the sub-region and/or around the sub-region are conducive for thunderstorm growth. Further, the forecast score or precipitation score for a given sub-region may be based on the convective initiation score of a cloud predicted to be in or near the sub-region and/or interest fields measured within the sub-region or a zone of influence around the sub-region. In other embodiments, it is unnecessary for the forecast score to be based on a convective initiation score. As an example, the forecast score or precipitation score may be based on measurements within the sub-region or a zone of influence for a sub-region without identifying cumulus clouds within satellite images. In addition, a machine-learning algorithm, as described herein, may be used to calculate any of the interest fields or other types of scores described herein.

Note that the techniques and interest fields described herein may be used to determine the probability or severity of any weather event. As an example, the input variables may be selected such that the score generated by the machine-learning algorithm indicates a severity of a predicted weather event associated with an identified cloud, such as an extent to which the identified cloud will produce precipitation in a certain time period. If desired, a first set of input variables may be used to determine a probability that a cloud will produce precipitation according to one machine-learning algorithm, and a second set of input variables (which may overlap at least to an extent with the first set) may be used to predict an extent that the cloud will likely produce precipitation or other weather event according to another machine-learning algorithm. U.S. Provisional Application No. 62/259,716, entitled "Systems and Methods for Forecasting Lightning and Severe Storms" and filed on Nov. 25, 2015, which is incorporated herein by reference, describes various interest fields and algorithms that may be used by the weather forecasting logic 50 to characterize any weather event as may be desired. According to the techniques described herein, one regression equation may be defined using machine learning to determine the probability of a weather event, and another regression equation may be defined using machine learning to determine the severity of the event, such as the amount of precipitation or lightning, or the strength of the wind. In other embodiments, other types of equations and techniques may be used.

Now, therefore, the following is claimed:

1. A weather forecasting system, comprising:
memory for storing satellite image data, weather data, and topographical data, the weather data indicative of atmospheric conditions within a geographic region, the topographical data indicating a topology of terrain within the geographic region; and
at least one processor programmed with instructions that, when executed by the at least one processor, cause the at least one processor to:
identify a cumulus cloud within the satellite image data;
track the cumulus cloud over time;
predict a path of the cumulus cloud;
identify a location within the predicted path;
determine a plurality of interest field values associated with the cumulus cloud based on the satellite image data and the weather data, the plurality of interest field values including at least a first interest field value and a second interest field value, wherein determination of the first interest field value is based on (1) an atmospheric condition of the cumulus cloud indicated by the weather data and (2) a portion of the topographical data at the identified location;
determine, based on the plurality of interest field values including at least the first interest field value, a plurality input variables for use in a machine learning algorithm for predicting weather events;
predict at least one weather event in the future for the geographic region via the machine learning algorithm based on the plurality of input variables; and
provide a weather forecast based on the predicted at least one weather event.

2. The system of claim 1, wherein the weather event is precipitation.

3. The system of claim 1, wherein the weather data includes a radar map indicative of an extent to which precipitation has occurred, is occurring, or is predicted to occur within the geographic region.

4. The system of claim 1, wherein determination of the first interest field value is based on a type of terrain indicated by the portion of the topographical data.

5. The system of claim 1, wherein the determination of the first interest field value is based on a slope indicated by the portion of the topographical data.

6. The system of claim 1, wherein the determination of the first interest field value is based on an elevation indicated by the portion of the topographical data.

7. The system of claim 1, wherein the atmospheric condition of the cumulus cloud is a predicted atmospheric condition for the cumulus cloud when the cumulus cloud is predicted to be at the identified location.

8. The system of claim 1, wherein the atmospheric condition is a predicted amount of precipitation expected for the cumulus cloud when the cumulus cloud is predicted to be at the identified location.

9. A weather forecasting method, comprising:
storing, in memory, satellite image data, weather data, and topographical data, the weather data indicative of atmospheric conditions within a geographic region, the topographical data indicating a topology of terrain within the geographic region;

identifying, with the at least one processor, a cumulus cloud within the satellite image data;
tracking the cumulus cloud over time with the at least one processor;
predicting, with the at least one processor, a path of the cumulus cloud based on the tracking;
identifying a location within the predicted path;
determining, with the at least one processor, a plurality of interest field values associated with the cumulus cloud based on the satellite image data and the weather data, the plurality of interest field values including at least a first interest field value and a second interest field value, wherein the determining the plurality of interest field values includes determining the first interest field value based on (1) an atmospheric condition of the cumulus cloud indicated by the weather data and (2) a portion of the topographical data at the identified location;
determining, with the at least one processor based on the plurality of interest field values including at least the first interest field value, a plurality input variables for use in a machine learning algorithm for predicting weather events;
predicting, with the at least one processor, at least one weather event in the future for the geographic region via the machine learning algorithm based on the plurality of input variables; and
providing a weather forecast based on the predicted at least one weather event.

10. The method of claim 9, wherein the weather event is precipitation.

11. The method of claim 9, wherein the weather data includes a radar map indicative of an extent to which precipitation has occurred, is occurring, or is predicted to occur within the geographic region.

12. The method of claim 9, wherein the determining the first interest field value is based on a type of terrain indicated by the portion of the topographical data.

13. The method of claim 9, wherein the determining the first interest field value is based on a slope indicated by the portion of the topographical data.

14. The method of claim 9, wherein the determining the first interest field value is based on an elevation indicated by the portion of the topographical data.

* * * * *